United States Patent [19]

Ming-Che

[11] Patent Number: 5,225,003
[45] Date of Patent: Jul. 6, 1993

[54] MULTI-PURPOSE SOLAR ENERGY BASE

[76] Inventor: Hong Ming-Che, P.O. Box 82-144, Taipei, Taiwan

[21] Appl. No.: 809,130

[22] Filed: Dec. 18, 1991

[51] Int. Cl.⁵ .............................................. H01L 35/00
[52] U.S. Cl. ..................................... 136/206; 362/183
[58] Field of Search ......................... 362/183; 136/206

[56] References Cited

U.S. PATENT DOCUMENTS

| | | | |
|---|---|---|---|
| 3,956,017 | 5/1976 | Shigemasa | 136/206 |
| 4,231,079 | 10/1980 | Heminover | 362/183 |
| 4,500,742 | 2/1985 | Morimoto et al. | 136/206 |
| 4,751,622 | 6/1988 | Williams | 362/183 |
| 4,759,735 | 7/1988 | Pagnol et al. | 362/183 |

*Primary Examiner*—Carroll B. Dority
*Attorney, Agent, or Firm*—Alfred Lei

[57] ABSTRACT

This invention relates to a multi-purpose solar energy base and in particular to one including a main body portion having a solar energy heat converging circuit therein and a threaded center hole provided with two conductors connected with an electrical wire extending downwardly through a hole of the main body portion to a recess, and a cover engaged with the bottom of the main body portion and having a raised rectangular edge on which is mounted an energy conversion circuit with a rechargeable battery, characterized in that the base may be adapted to various kinds of products thereby rendering it to have many practical uses.

2 Claims, 7 Drawing Sheets

5,225,003

MULTI-PURPOSE SOLAR ENERGY BASE

BACKGROUND OF THE INVENTION

Difficulties with fossil fuels have led to the invention of devices that directly convert solar energy into usable forms of energy, such as electricity. Solar batteries, which operate on the principle that light falling on photosensitive substances causes a flow of electricity, play an important part in astronautics.

Hence, there is a need for a multi-purpose solar energy base which may be adapted for use with various products.

SUMMARY OF THE INVENTION

This invention relates to a multi-purpose solar energy base.

It is the primary object of the present invention to provide a multi-purpose solar energy base which is engageable with various products such as an electric clock, a computer, a warning lamp, a fan, etc.

It is another object of the present invention to provide a multi-purpose solar energy base which may be connected with a safety lamp for a traffic policeman, a sweeper, and so on.

It is still another object of the present invention to provide a multi-purpose solar energy base which may be used as a cat's eye.

It is still another object of the present invention to provide a multi-purpose solar energy base which may supply power to a neon lamp.

It is a further object of the present invention to provide a multi-purpose solar energy base which is portable and convenient to use.

Other objects and merits and a fuller understanding of the present invention will be obtained by those having ordinary skill in the art when the following detailed description of the preferred embodiment is read in conjunction with the accompanying drawings.

DETAILED DESCRIPTION OF THE PREFERRED EMBODIMENT

Figure 1:
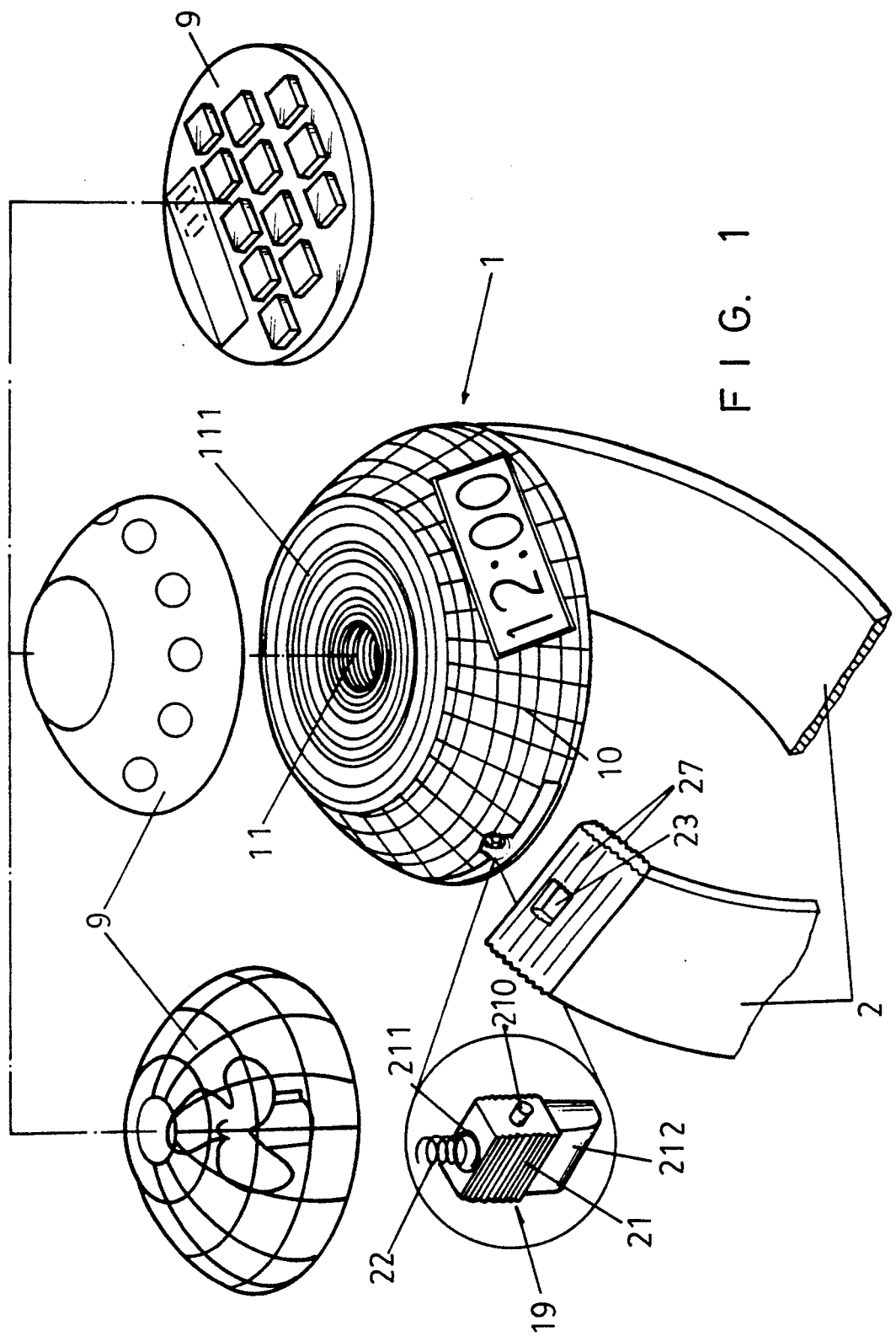
FIG. 1 is a perspective view of a multi-purpose solar energy base according to the present invention.
Figure 2:
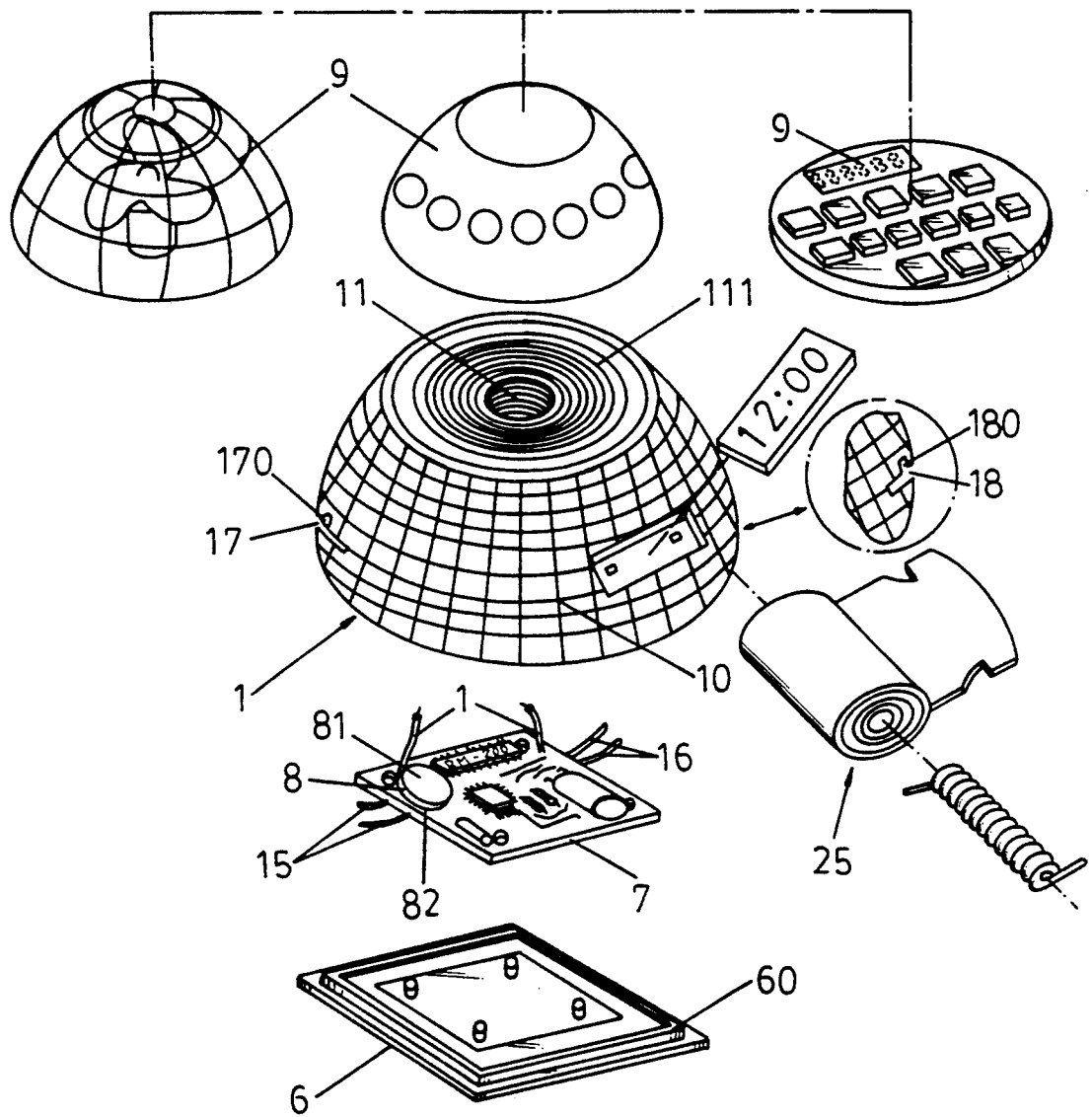
FIG. 2 is an exploded view of the present invention.

With reference to the drawings and in particular to FIGS. 1 and 2 thereof, the multi-purpose solar energy base according to the present invention mainly comprises a main body portion 1 made of transparent heat-resistant material and having a solar energy heat converging circuit 10 therein. On the center of the main body portion 1 there is a threaded hole 11 provided with two conductors 3 which are respectively connected with an electrical wire 30 extending downwardly through a hole 13 of the main body portion 1 to a recess 12 (see FIG. 3). Further, the top surface of the main body portion 1 is formed with spiral lines 111.

The recess 12 is formed with an edge 14 around which is a groove 141. The vertical side of the recess 12 has two passages 15 and 16 which extend through the main body portion 1 to form elongated slots 17 and 18 respectively. A conductor 4 is arranged between the passage 15 and the elongated slot 17 while a second conductor 5 located between the passage 16 and the elongated slot 18. The conductors 4 and 5 are respectively connected with electrical wires 40 and 50 which extend through the main body portion 1 into the recess 12.

The solar energy heat converging circuit 10 enclosed in the main body portion 1 is connected with two electrical wires 100 which extend through the main body portion 1 into the recess 12.

A cover 6 is engaged with the bottom of the main body portion 1 and has a raised rectangular edge 60 on which is mounted an energy conversion circuit 7 with a rechargeable battery.

The electrical wires 100 connected with the solar energy heat converging circuit 10 is connected with the energy conversion circuit 7 on the cover 6.

The electrical wires 30 connected with the conductors 3 and the electrical wires 40 and 50 connected with the conductors 4 and 5 are respectively connected to the positive pole 81 and negative pole 82 of the rechargeable battery 8 to form independent circuits.

The threaded hole 11 of the main body portion 1 is engageable with all suitable accessories 9 such as a lamp, a warning light, an electrical clock, a computer, a fan, an electric torch, a neon lamp, etc. However, the lower end of such accessories 9 must be provided with a projected portion 90 with external threads 90 and two conducting contacts 91 so that when any one of the accessories 9 is engaged with the threaded hole 11 of the main body portion 1, the conducting contacts 91 will be in contact with the conductors 3 on the bottom of the threaded hole 11.

The bottom of each accessories 9 is provided with spiral lines 92 adapted to engage with the spiral lines 111 on the top surface of the main body portion 1 so that no water may enter into the present invention.

In addition, the elongated slots 17 and 18 are respectively provided with positioning devices 19 and 20 which are composed of a base 21 and a tension spring 22.

On the upper section of the elongated slots 17 and 18 there are two notches 170 and 180 for engaging with two pins 210 of the positioning devices 19 and 20 so that the bases 21 may be moved up and down.

A band 2 may be engaged with the positioning devices 19 and 20 in the notches 170 and 180 of the elongated slots 17 and 18 when inserted into the elongated slots 17 and 18 and may be kept in position by the engagement between the lower end 212 and the hole 23 of the band 2.

Both ends of the band 2 are provided with raised lines 27 for obtaining close engagement between the bands 2 and the elongated slots 17 and 18 thereby water from entering therein.

Figure 3:
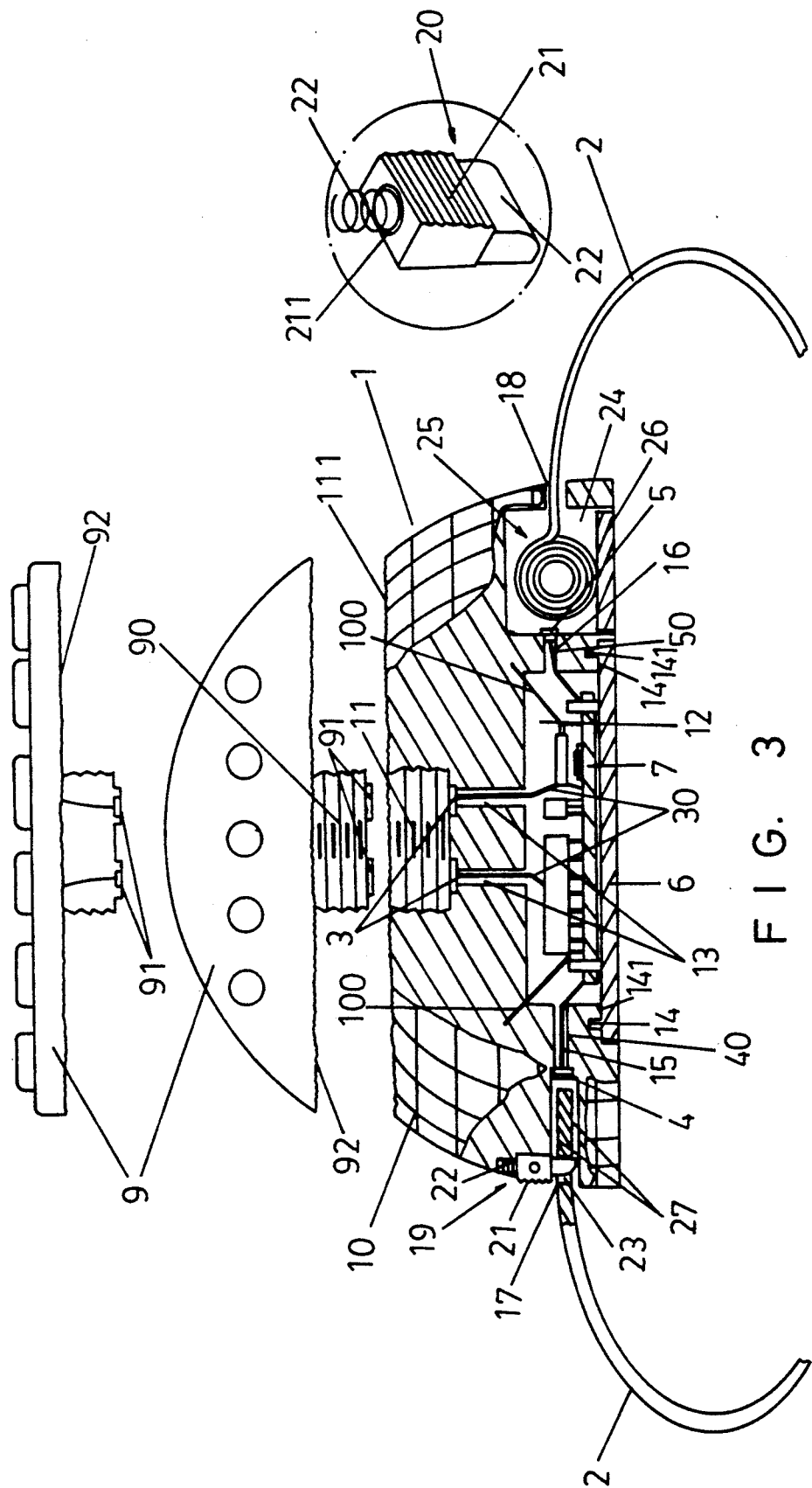
FIG. 3 is a sectional view of the present invention.

As illustrated in FIG. 3, the cover 6 of the main body portion 1 is provided with a chamber 24 in which there is a winding device 25. Further, the chamber 24 is closed with a cover 6.

Figure 4:
FIG. 4 shows a first application of the present invention.
Figure 6:
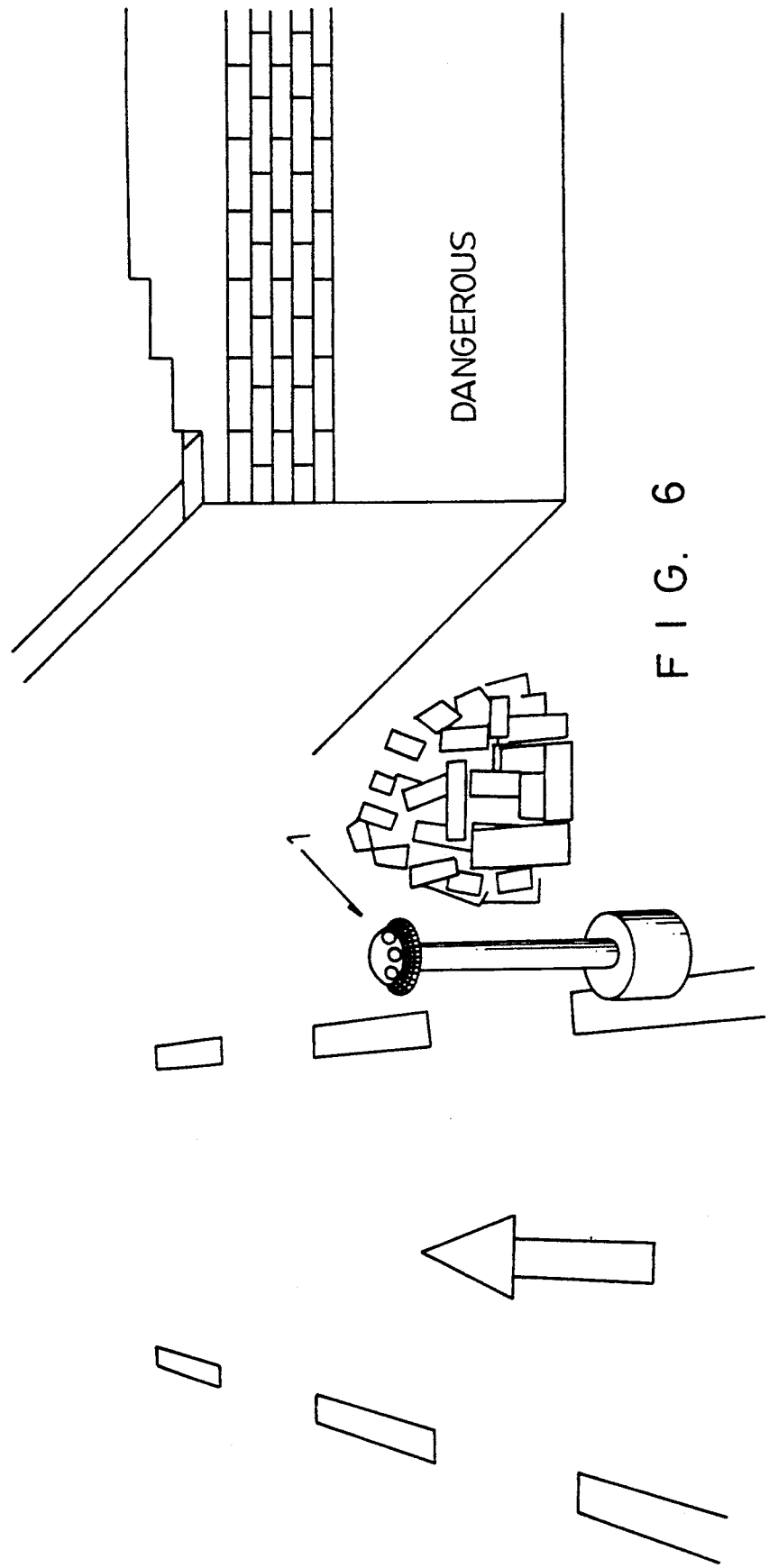
FIG. 6 shows a third application of the present invention.
Figure 7:
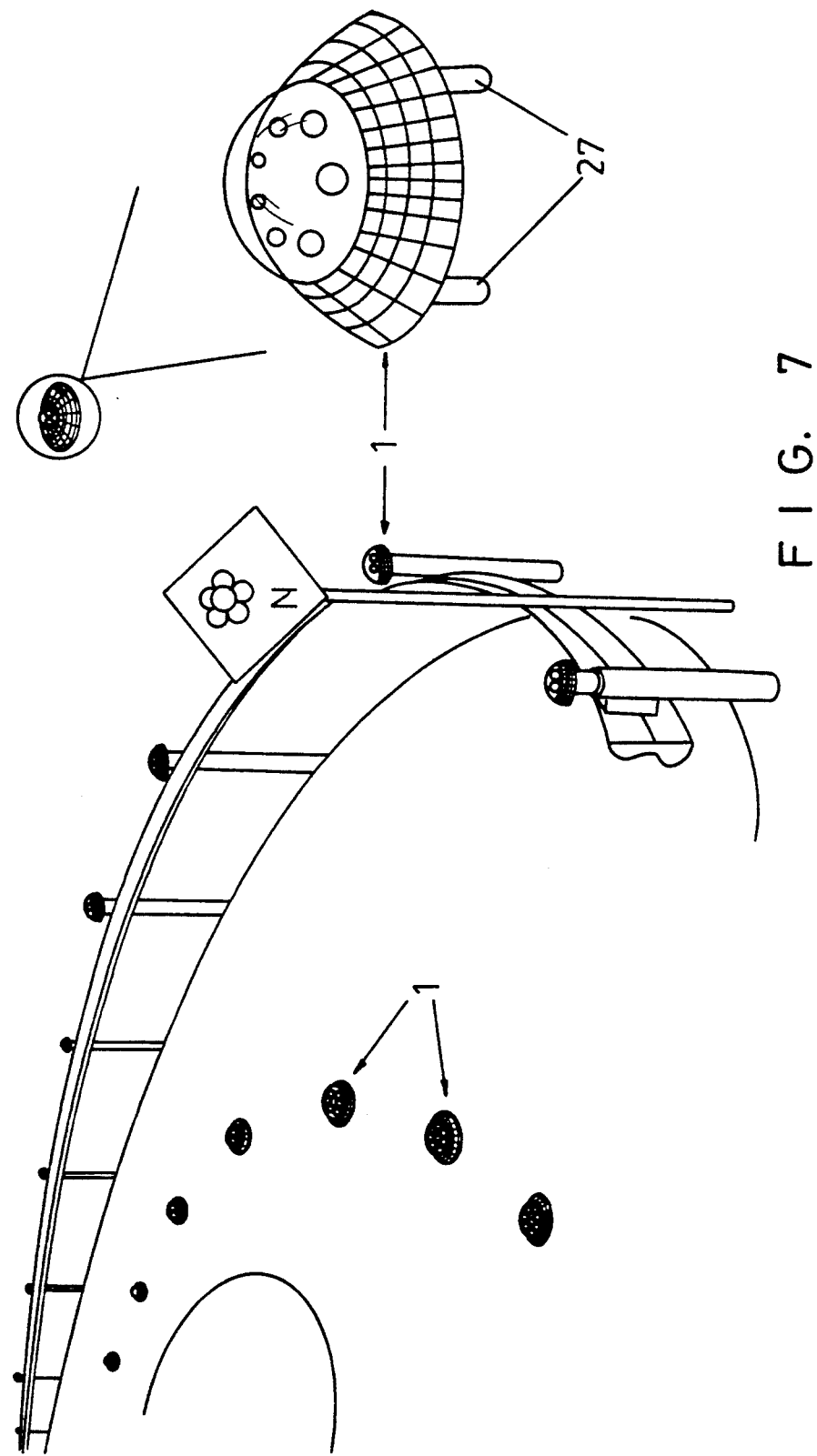
FIG. 7 shows a fourth application of the present invention.

Hence, the present invention may be convenient applied in the way as shown in FIGS. 4 and 6 by means of the bands 2.

Figure 5:
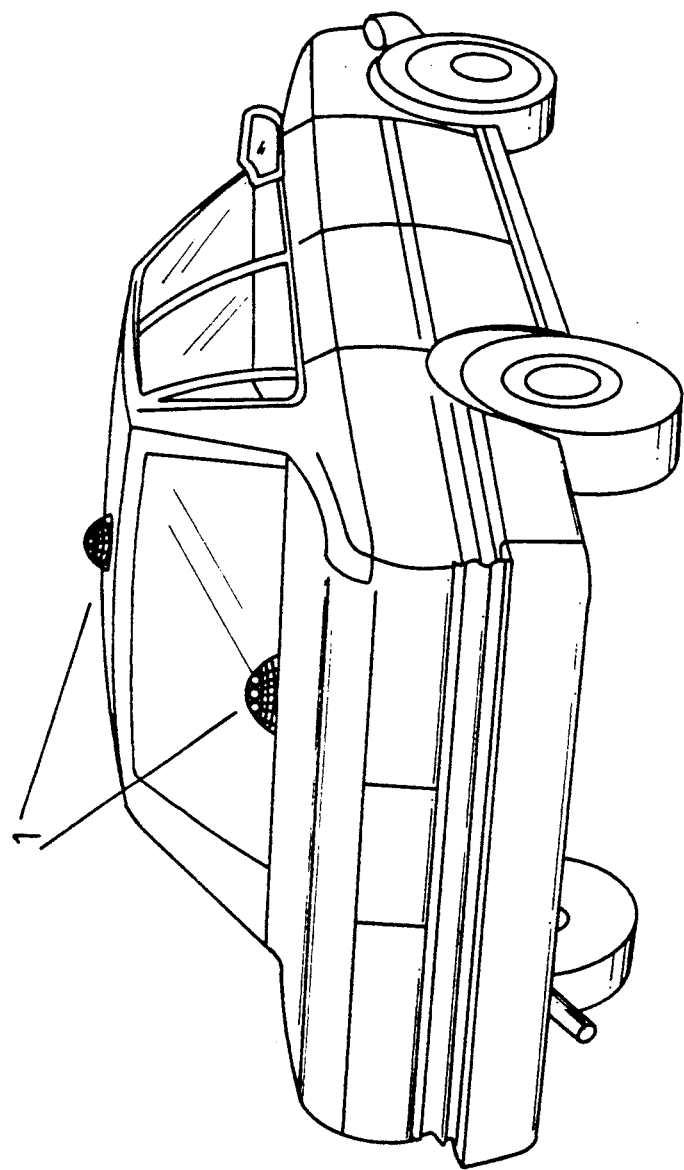
FIG. 5 shows a second application of the present invention.

In addition, the present invention may be used as a warning light as shown in FIG. 5.

Moreover, the bottom of the main body portion 1 may be provided with two feet 27 so that the present invention may be fixedly mounted on the road as a cat's eye.

Although the present invention has been described with a certain degree of particularity, it is understood that the present disclosure is made by way of example only and that numerous changes in the detail of construction and the combination and arrangement of parts may be resorted to without from the scope and spirit of the invention as hereinafter claimed.

I claim:

1. A multi-purpose solar energy base comprising:

a main body portion having a solar energy heat converging circuit therein and a threaded center hole provided with two conductors connected with an electrical wire extending downwardly through a hole of said main body portion to a recess, said main portion further having spiral lines on the top, said recess being formed with an edge around which is a groove, the vertical side of said recess having two passages which extend through said main body portion to form elongated slots, a first conductor being arranged between a passage and an elongated slot while a second conductor being located between the other passage and the other elongated slot, said conductors being respectively connected with electrical wires which extends through said main body portion into said recess; and a cover engaged with the bottom of said main body portion and having a raised rectangular edge on which is mounted an energy conversion circuit with a rechargeable battery;

whereby the threaded hole of said main body portion may be engageable with various accessories.

2. The multi-purpose solar energy base as claimed in claim 1, wherein one of said elongated slots is formed with a room which is designed to receive a winding device and is sealed with a cover.

* * * * *